US007011146B2

(12) United States Patent
Wong

(10) Patent No.: US 7,011,146 B2
(45) Date of Patent: Mar. 14, 2006

(54) MICROCHANNEL HEAT PIPE WITH PARALLEL GROOVES FOR RECYCLING COOLANT

(75) Inventor: Shwin-Chung Wong, Hsinchu (TW)

(73) Assignee: NationalTsing Hua University, Hsinchu (TW)

(*) Notice: Subject to any disclaimer, the term of this patent is extended or adjusted under 35 U.S.C. 154(b) by 135 days.

(21) Appl. No.: 10/785,174

(22) Filed: Feb. 24, 2004

(65) Prior Publication Data

US 2004/0196633 A1 Oct. 7, 2004

(30) Foreign Application Priority Data

Feb. 27, 2003 (TW) .............................. 92104359 A

(51) Int. Cl.
*F28D 15/02* (2006.01)

(52) U.S. Cl. ............................ 165/104.33; 165/104.26

(58) Field of Classification Search ................ 165/185, 165/104.33, 104.26, 104.21
See application file for complete search history.

(56) References Cited

U.S. PATENT DOCUMENTS 3,613,778 A * 10/1971 Feldman, Jr. .......... 165/104.26
4,274,479 A * 6/1981 Eastman ................ 165/104.26
6,019,165 A * 2/2000 Batchelder ............. 165/104.33
6,601,643 B1 * 8/2003 Cho et al. .............. 165/104.26
6,681,843 B1 * 1/2004 Sugito ................... 165/104.33
6,698,503 B1 * 3/2004 Son et al. .............. 165/104.26
6,705,390 B1 * 3/2004 Ohara ................... 165/104.21
2002/0062648 A1 * 5/2002 Ghoshal ................ 165/104.33
2005/0098303 A1 * 5/2005 Lindemuth et al. .... 165/104.26

* cited by examiner

*Primary Examiner*—Teresa J. Walberg
(74) *Attorney, Agent, or Firm*—H. C. Lin

(57) ABSTRACT

Heat from a heat generating device such as CPU is dissipated by a heat sink device containing a recycled two-phase vaporizable coolant. The coolant recycles inside a closed metal chamber, which has an upper section and a lower section connected by a conveying conduit, and a wick evaporator placed in connection with the lower section. The liquid coolant in the evaporator is vaporized by the heat from the heat generating device. The coolant vapor enters the upper section and condenses therein, with the liberated latent heat dissipated out through the inner top chamber wall. The condensed coolant is then collected and flows into the lower section, and further flows back to the wick evaporator by capillary action of the evaporator, thereby recycling the coolant. Space or a piece of element with parallel grooves is used to at least one of the sections to reduce friction in the liquid flow path.

2 Claims, 20 Drawing Sheets

MICROCHANNEL HEAT PIPE WITH PARALLEL GROOVES FOR RECYCLING COOLANT

BACKGROUND OF THE INVENTION (1) Field of the Invention

This invention relates to a heat pipe, in particular, a microchannel heat pipe used for heat dissipation for a central processing unit (CPU) or other electronic integrated circuit (IC) chips.

(2) Brief Description of Related Art

The latest generation of Pentium IV CPU generates power more than 100 watts (Joule/sec). In order to maintain its normal performance and avoid overheating of the unit, more effective heat dissipating mechanism is needed. U.S. Pat. No. 5,880,524 discloses a heat pipe for spreading the heat generated by a semiconductor device as shown in FIG. 1. A cavity 105 is enclosed by a base metal 100 for a working liquid (not shown in the figure) to recycle. Heat sink pipes 101 are arranged on the top of the base metal 100 for heat dissipation. Heat transfer medium 102 is under the base metal 100 to contact with a CPU.

A two-phase vaporizable liquid resides within the cavity 105 and serves as the working fluid (the coolant) for the heat pipe. A wick 103 in the form of a mesh is disposed on the inner walls to form a recycling loop within cavity 105 to facilitate the flow of the working fluid within the cavity. The working liquid in the cavity 105 flows in a direction as shown in arrows in FIG. 1. Firstly the working liquid is absorbed in the bottom portion of the wick 103. It evaporates when heat is transferred from the CPU and then condenses on the top portion of the wick 103. Heat is further transferred upward to the heat sink pipes 101. The condensed liquid absorbed in the top portion of the wick 103 is then moved to the lower portion of the wick 103 due to capillary action in the mesh of the wick 103.

SUMMARY OF THE INVENTION

An object of this invention is to devise a coolant recycle mechanism with space passages as part of the recycling passage to decrease the friction during the coolant flowing. Another object of this invention is to devise a coolant recycle mechanism with parallel grooves as a part of the passage to decrease the friction during flowing of the working liquid. A further object of this invention is to devise a more effective heat dissipation mechanism.

The above objects can be achieved by using space passages, parallel grooves or a combination of both to be part of the passage for liquid flowing to reduce friction. By using space passages and/or parallel grooves, the friction is reduced and the capillary action effectively enhances the flow of the coolant.

DETAILED DESCRIPTION OF THE INVENTION

Figure 1:
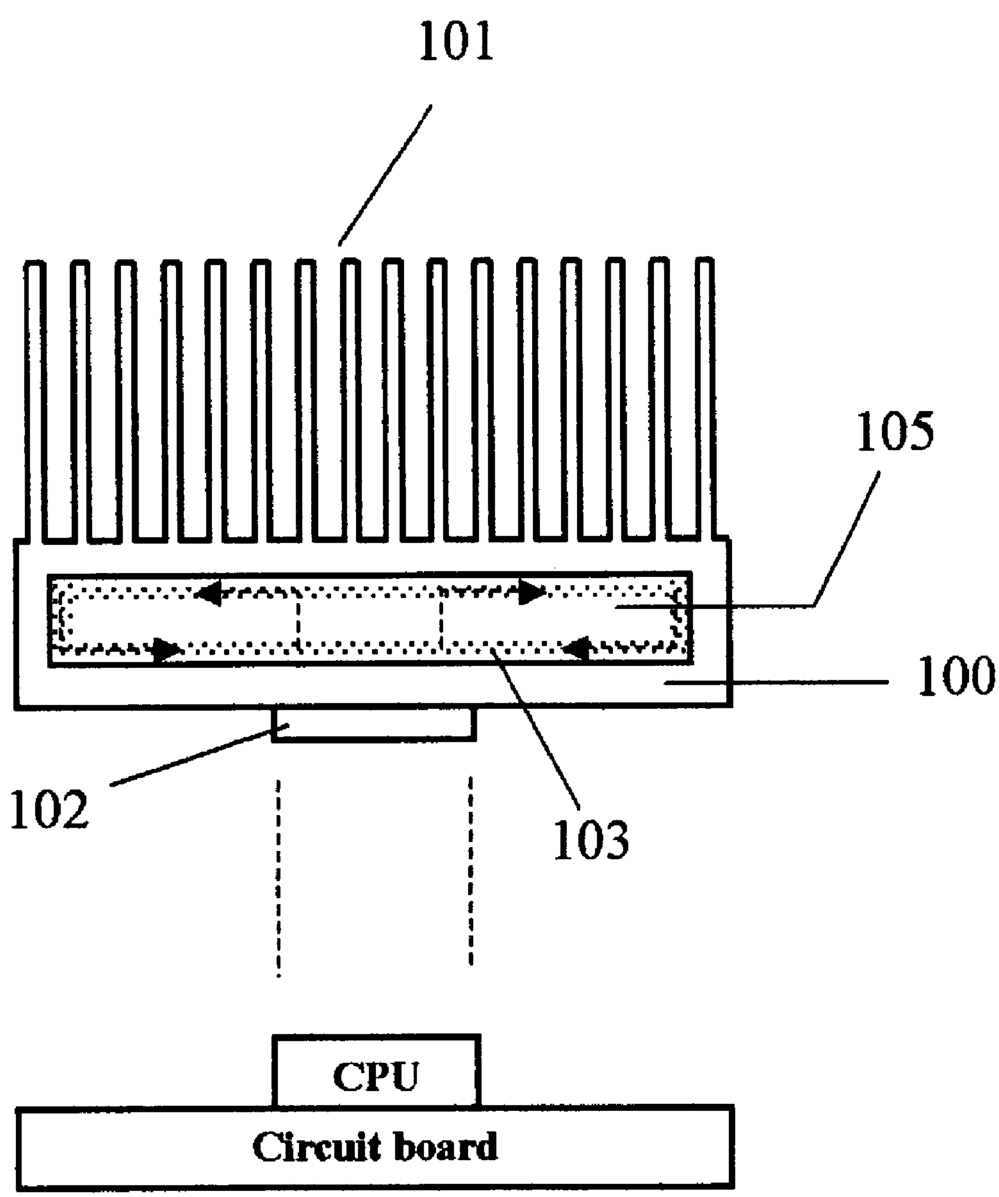
FIG. 1 Prior art.
Figure 2:
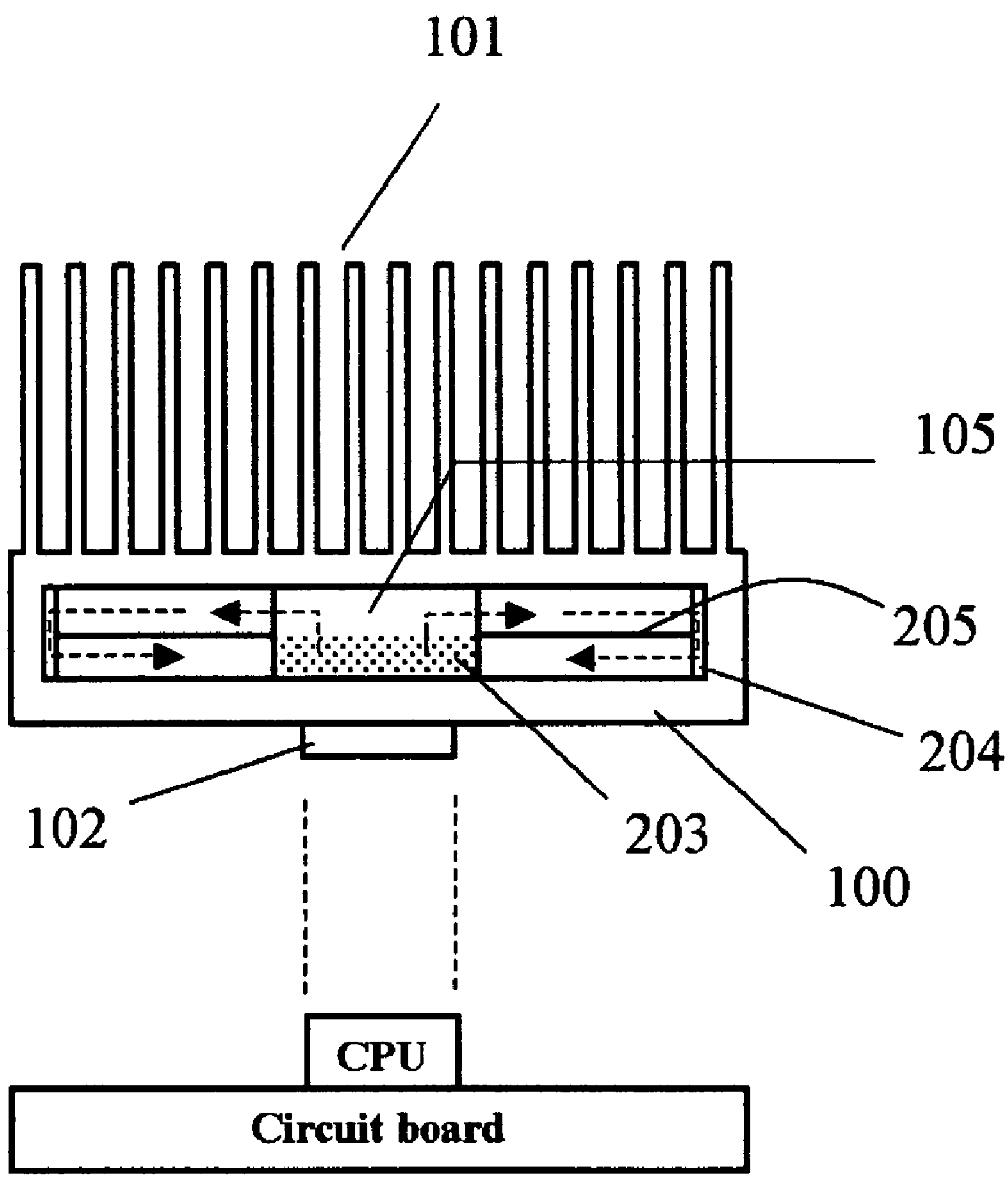
FIG. 2 First embodiment of this invention.

The principle of this invention is to use space passages or parallel grooves as part of the passage for a working liquid to flow within a cavity 105 in a heat pipe. FIG. 2 shows the first embodiment of this invention. Cavity 105 is enclosed by a base metal 100. Multiple sections are divided in the cavity 105 for the recycling of the working liquid. The working liquid moves in a direction following the arrows shown in the figure.

Figure 3:
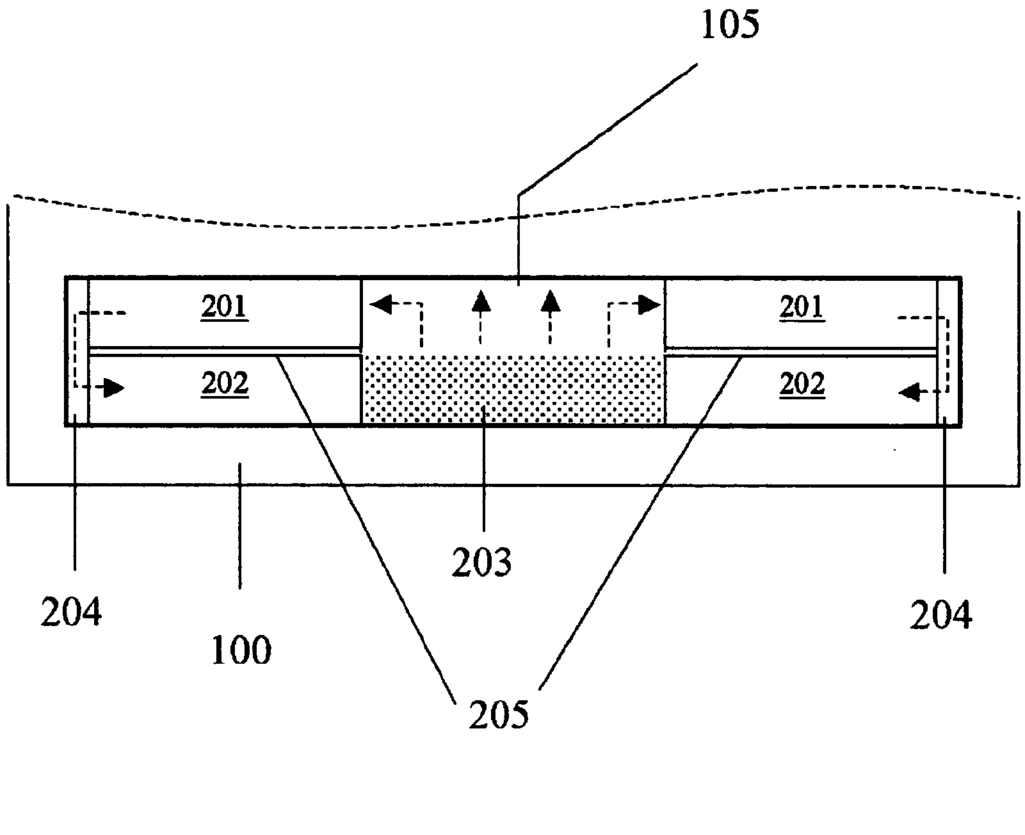
FIG. 3 Enlarged plane view of the recycle mechanism of FIG. 2.

FIG. 3 shows an enlarged plane view of the recycle mechanism in the cavity 105 of FIG. 2. There are four sets of parallel grooves shown in this design. A first set of left parallel grooves 201 and a second set of left parallel grooves 202 arranged on the left of the wick 203. A third set of right parallel grooves 201 and a fourth set of right parallel grooves 202 arranged on the right side of the wick 203. The recycling principle for the left two set grooves 201 and 202 is exactly the same as that for the right-side two sets grooves 201 and 202, and therefore only two left side grooves are described below.

Working liquid (not shown) is absorbed in the wick 203. The wick 203 can be made of sintered copper (Cu) powder, sintered nickel (Ni) powder, or sintered stainless-steel powder. Alternatively, wick 203 can be made of single-layer or multi-layer of metal mesh (not shown) or metal cloth (not shown). When the heat pipe is attached to a heat generating unit such as a central process unit (CPU), the work liquid in the wick 203 is heated to evaporate and gives vapors upward as shown in the arrows. Part of the vapor condenses on the inner top surface within the cavity 105, which is enclosed by the base metal 100. Part of the vapor goes into a first set of parallel grooves 201 to condense. The condensed liquid is conveyed to a second set of parallel grooves 202 under the first set of parallel grooves 201 through a slot 204. The conveying slot 204 is located at a common end of the two sets of grooves to connect the two grooves 201 and 202. The wick 203 is located on the other end of the grooves 202 to form a recycle loop. The upward evaporation from the wick 203 results in a capillary pulling force to the working liquid in grooves 202 toward wick 203 to make a full cycle: liquid→vapor→cooling→liquid, following the arrows as shown in FIG. 3.

The following several figures show the recycle mechanism of this invention within the cavity 105.

Figure 4:
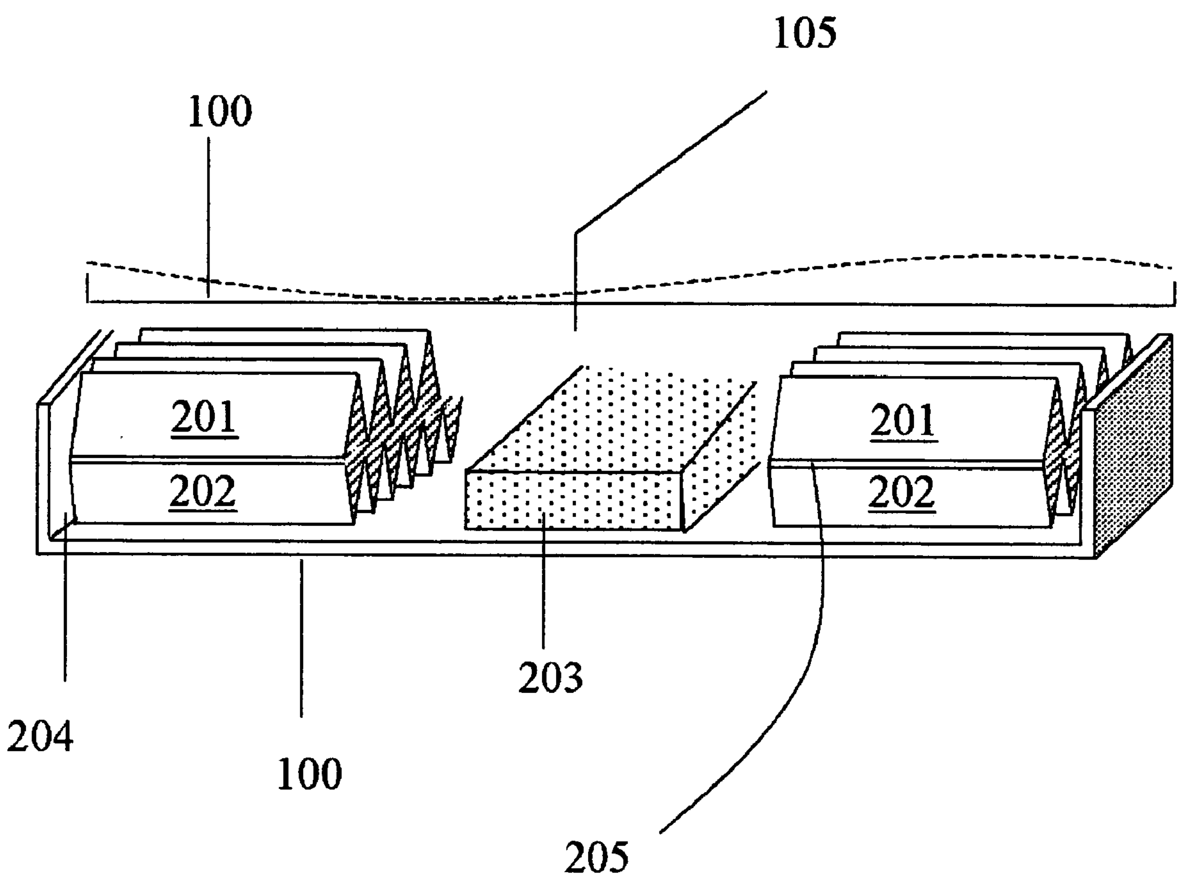
FIG. 4 Explosive and elevation view of the recycle mechanism of FIG. 2.

FIG. 4 shows the explosive perspective view of the recycle mechanism of FIG. 2. The parallel grooves 201 and 202 can be made separately before being connected together. Alternatively, the parallel grooves 201 and 202 can be also made integrally to be a single body by molding, extrusion, etching, cutting, or machining on a metal plate.

In order to insure the recycle to operate in a smooth loop, single way forward movement is desired for the first set of parallel grooves 201 which accommodates essentially vapor molecules. For this purpose, single-sided grooves are desired for the first set of parallel grooves 201. However, for the second set of parallel grooves 202 where condensed liquid flows, either a single-sided grooves or a double-sided grooves works the equally well. Double-sided grooves can be made by a folded metal sheet (not shown). Single sided grooves 202 are shown in FIG. 4. They can be made by the way of molding, extrusion, etching, cutting, or machining on a metal plate.

In this embodiment, the grooves 201 and 202 are essentially independent of each other except being communicated by the slot 204 so that the liquid flowing in grooves 202 is not dragged by the vapor flow in the opposite direction.

Part of the vapor entering the first set of the parallel grooves 201 condenses to liquid, and is gathered in the corners of the triangular microchannels of the grooves 201. A conveying slot 204 is placed on one end of the first set of parallel grooves 201. The cross-sectional shape of the grooves is triangular as illustrated, or of other shapes, such as: rectangular, or trapezoidal . . . etc. The base material for grooves 201 and 202 is illustrated with metal. However, nonmetal material such as silicon or plastics . . . etc. may also be used.

A second set of parallel grooves 202 is arranged under the first set of parallel grooves 201. The conveying slot 204 is at the first end of the second set of parallel grooves 202. The wick 203 is placed in the second end of the second set of parallel grooves and has a height no less than the height of the grooves 202 so as to generate a pulling force from grooves 202 toward the wick 203 when the working fluid evaporates from the wick 203. A dividing plate 205 is used to separate the first set of parallel grooves 201 and the second set of parallel grooves 202.

Figure 5:
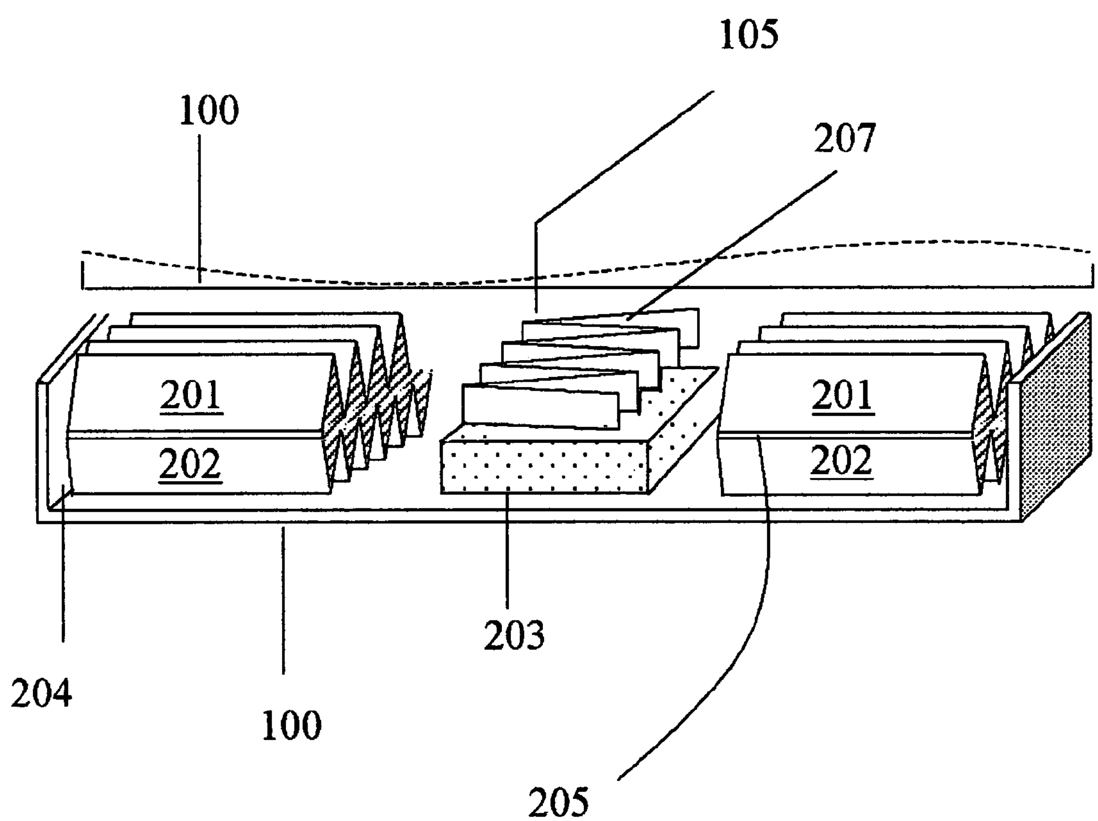
FIG. 5 Second embodiment of this invention.

FIG. 5 shows a second embodiment of this invention. This embodiment shows a vertical guiding plate 207 added above the wick 203 to bridge the wick 203 and the inner top surface of the base metal 100 within the cavity 105. The guiding plate 207 allows part of the condensed liquid on the inner top surface to flow downward back to the wick 203. The guiding plate 207 also serves as a strengthener against the inward pressure when the cavity 105 is evacuated.

Figure 6:
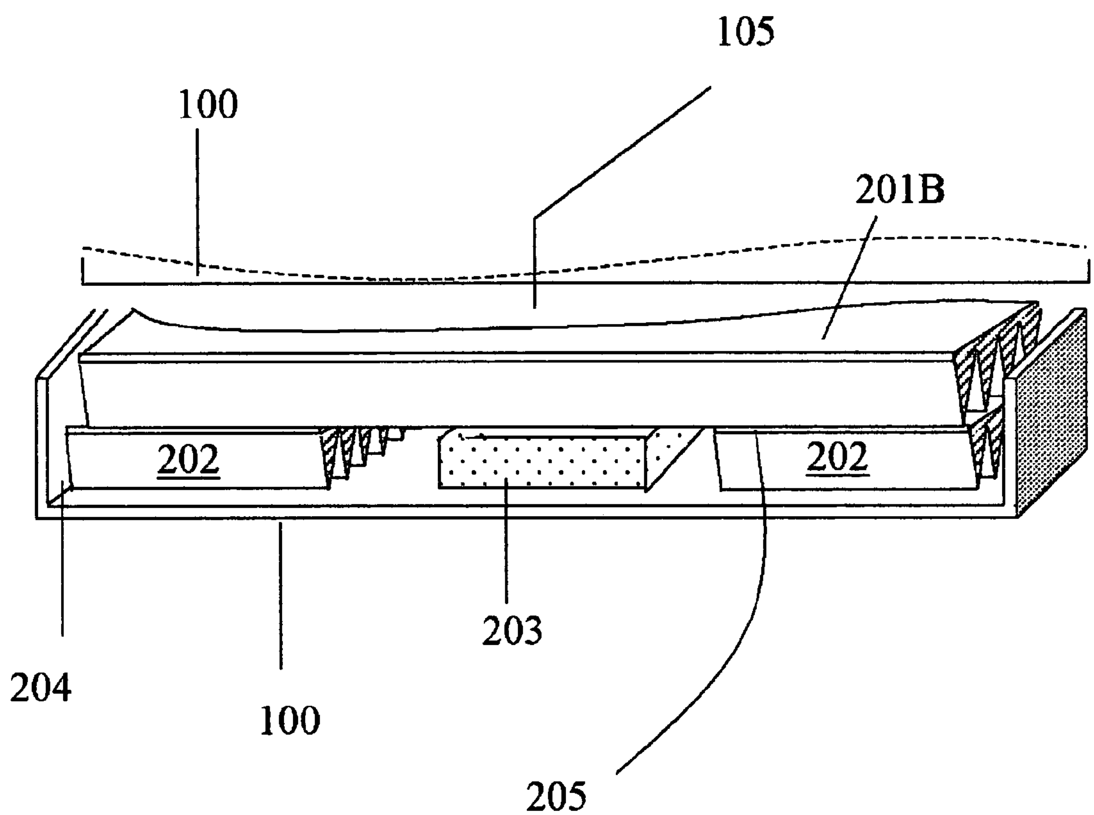
FIG. 6 Third embodiment of this invention.

FIG. 6 shows a third embodiment of this invention. This embodiment shows an elongated grooves 201B arranged over the top of the wick 203.

Figure 7:
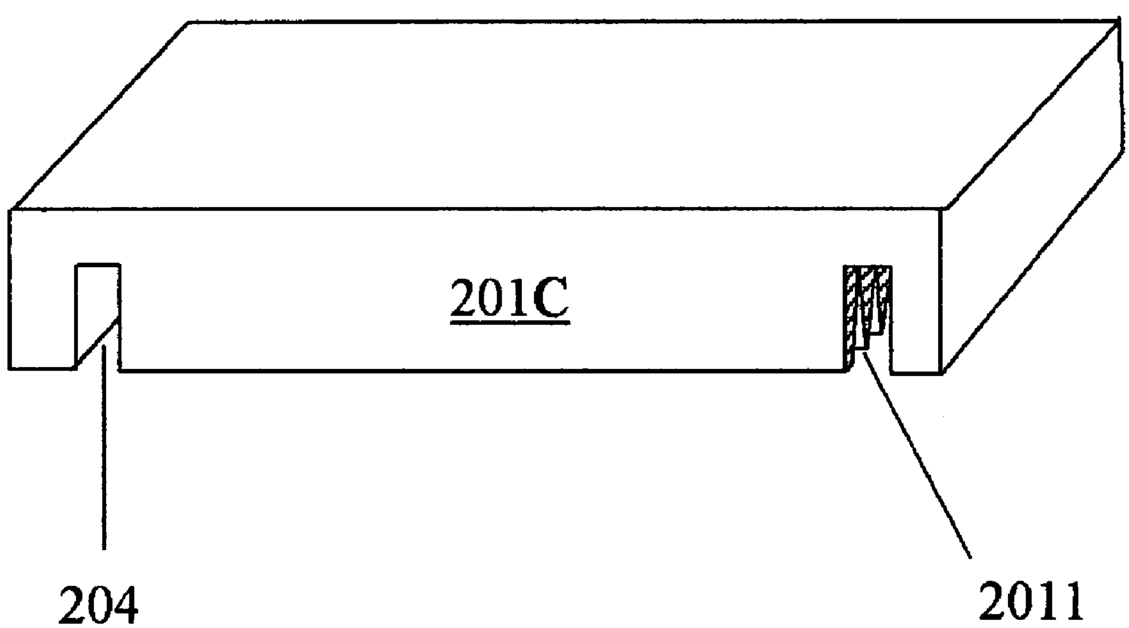
FIG. 7 Fourth embodiment of this invention.

FIG. 7 shows a fourth embodiment of this invention. This embodiment shows that the first set of parallel grooves and the conveying slot 204 are integrated with the top part of the base metal 100 to form a top metal base 201C. Parallel grooves 2011 and the conveying slot 204 can be fabricated by molding, cutting, scribing, or etching, etc. directly on the base metal 100.

Figure 8:
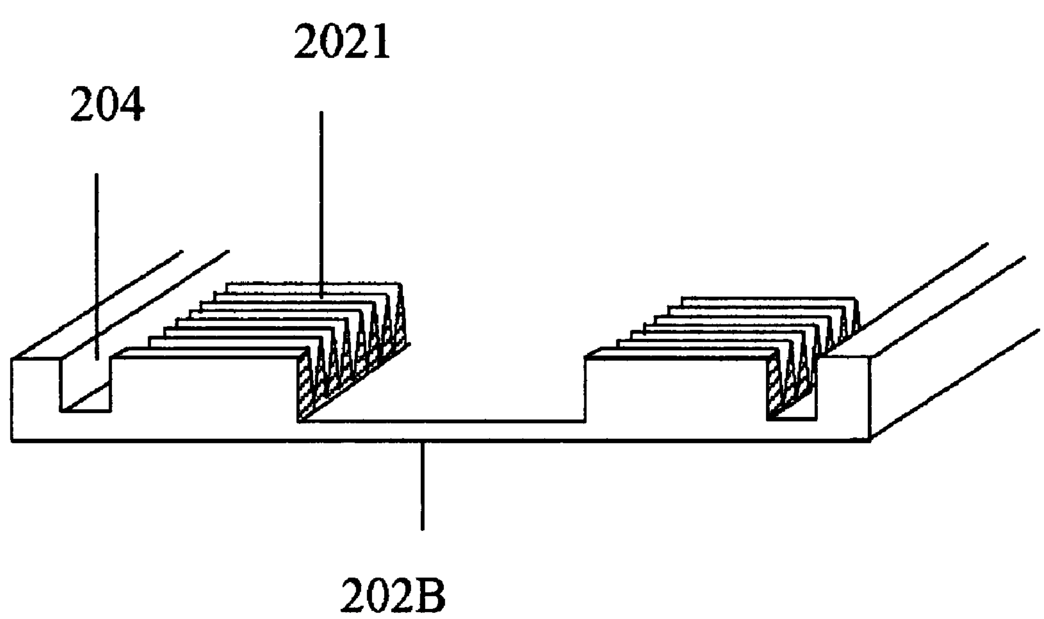
FIG. 8 Fifth embodiment of this invention.

FIG. 8 shows a fifth embodiment of this invention. Similar to the fourth embodiment of FIG. 7, the second set of parallel grooves 202 and the conveying slot 204 can be integrated with the bottom part of the base metal 100 to form the bottom metal base 201C. Parallel grooves 2021 and the conveying slot 204 can be fabricated by molding, cutting, scribing, or etching, etc. directly on the base metal 100.

Figure 9:
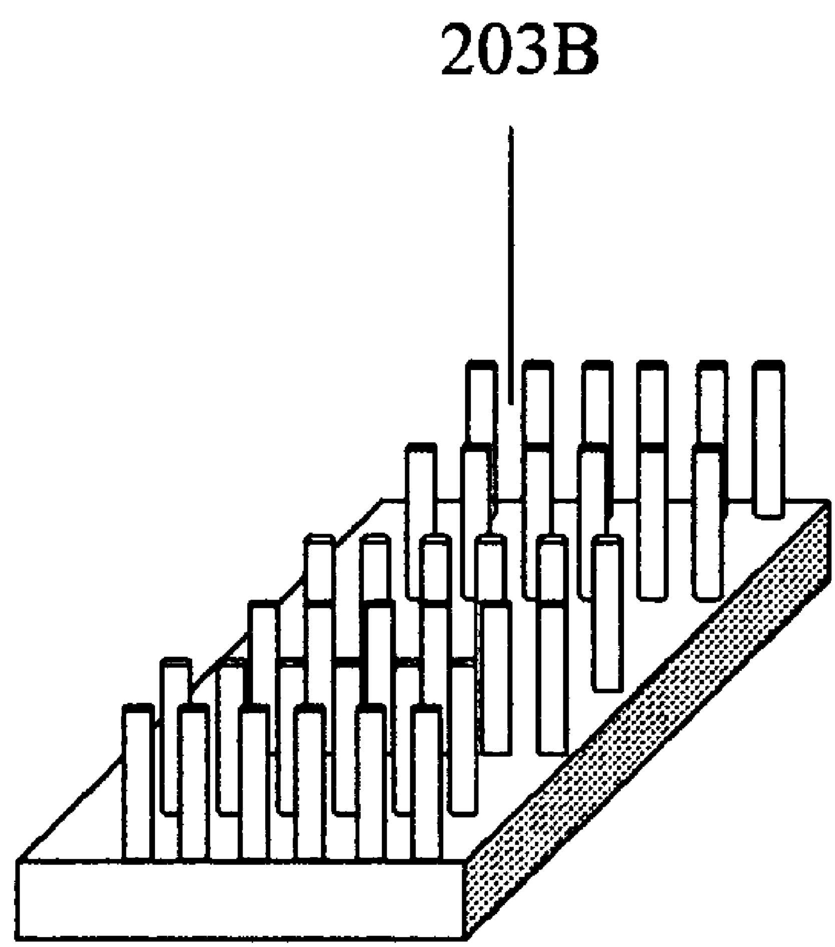
FIG. 9 Sixth embodiment of this invention.

FIG. 9 shows a sixth embodiment of this invention. This embodiment shows the wick 203 in the previous embodiments is replaced with a pin-array block 203B. The spaces between the pins are used to absorb the working liquid by capillary attraction. These vertical spaces allow for easy escape of bubbles once they are formed under high heat power conditions. This design is aimed at extending the dry-out limits of the working liquid in the wick 203. This design shows better efficiency in liquid flow compared with the sintered-metal-powder or mesh wick 203 to enhance the cooling effectiveness.

Figure 10:
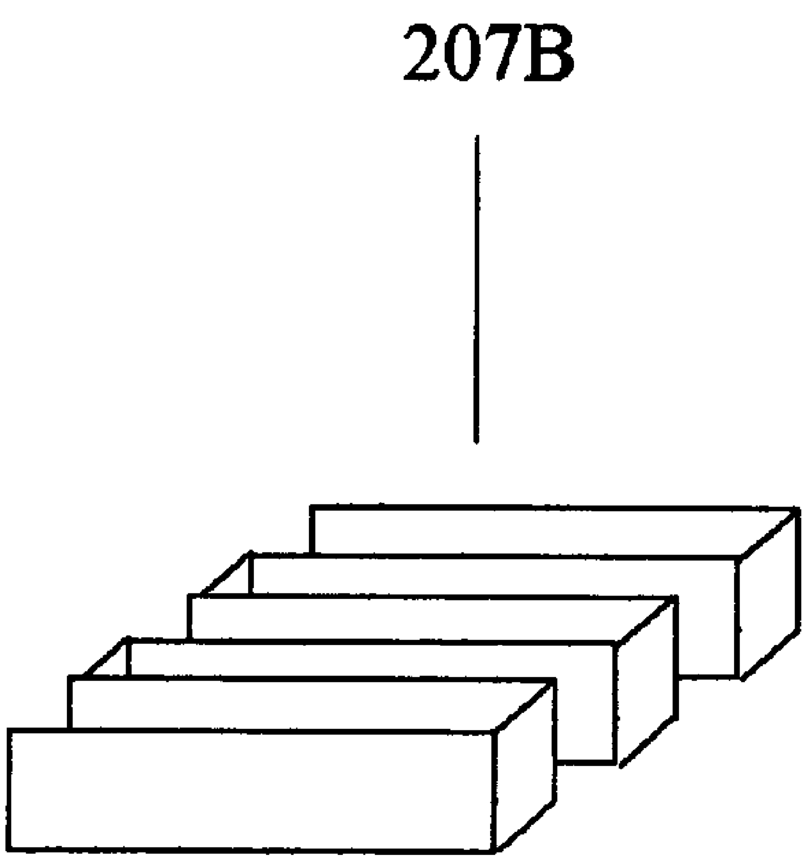
FIG. 10 Seventh embodiment of this invention.

FIG. 10 shows a seventh embodiment of this invention. This embodiment shows a different shape of folded metal 207B being used. A square folded metal 207B is used in this embodiment, which differs from the V-shape folded metal 207 in FIG. 5. Other folded metals are also usable, such as spiral folding, S shaped folding, . . . etc., and are not exhaustive in this specification.

Figure 11:
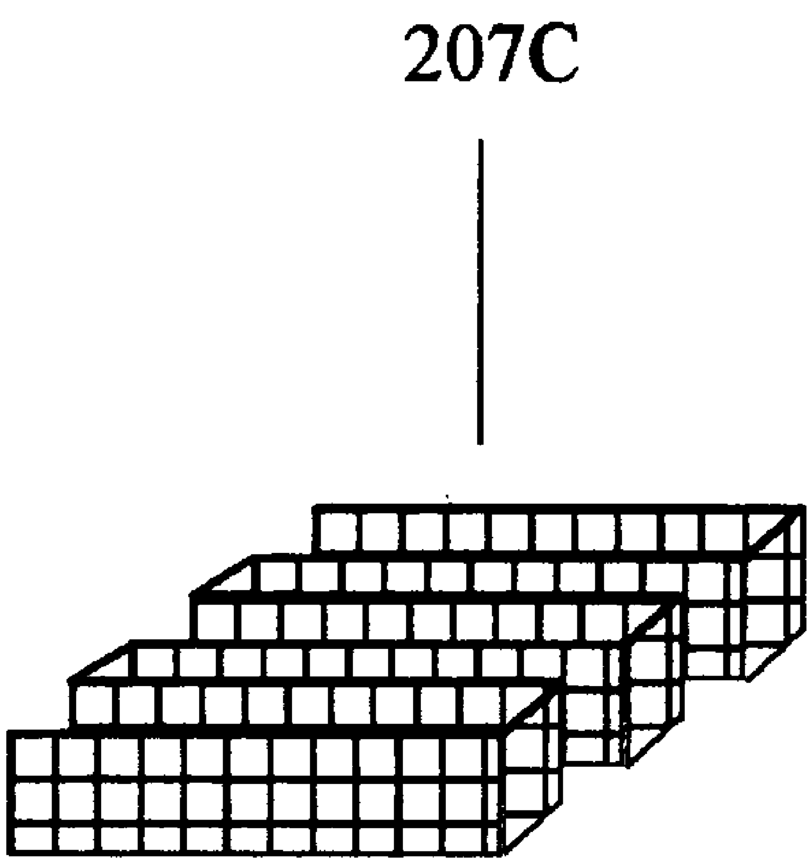
FIG. 11 Eighth embodiment of this invention.

FIG. 11 shows an eighth embodiment of this invention. This embodiment shows that a meshed metal 207C is used as the guiding plate, which differs from the non-meshed guiding plate 207B used in FIG. 10.

Figure 12:
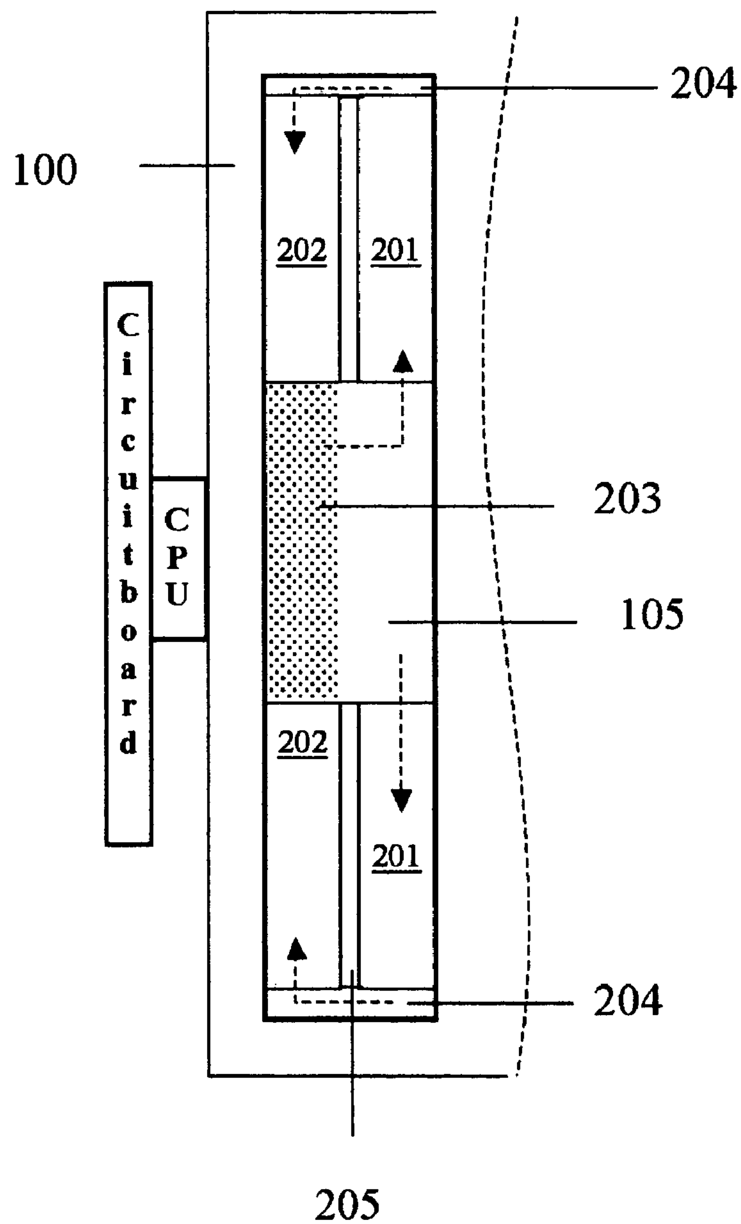
FIG. 12 Vertical use of the invention.

FIG. 12 shows a ninth embodiment of this invention. This embodiment shows that this invention as shown in FIG. 3 can be used in a vertical direction. Part of the vapor from the wick 203 condenses directly on the inner wall opposite to the wick 203 or enters the first set of bottom parallel grooves 201 and condenses herein. The condensed liquid flows downward, driven by the vapor flow as well as the gravity, into the liquid pool at the bottom end. With the combined capillary action of the wick 203 and of the parallel grooves 202, the working liquid is pulled up back to the wick 203.

Part of the vapor from the wick 203 goes up to the first set of top parallel groves 201 and condensed herein. Some of the condensed liquid may drop into the first set of bottom parallel grooves 201. Some of the condensed liquid is driven upward by the vapor flow to enter the top conveying slot and then the second set of parallel grooves 202, before it finally flows back to the wick 203.

In order to enhance the capillary action to increase the pulling force to the recycled liquid for those embodiments where two sets of parallel grooves are used, the hydraulic diameters (or the cross-sectional areas of the flow path) of the second set of parallel grooves 202 are made smaller than those of the first set of parallel grooves 201.

Figure 13:
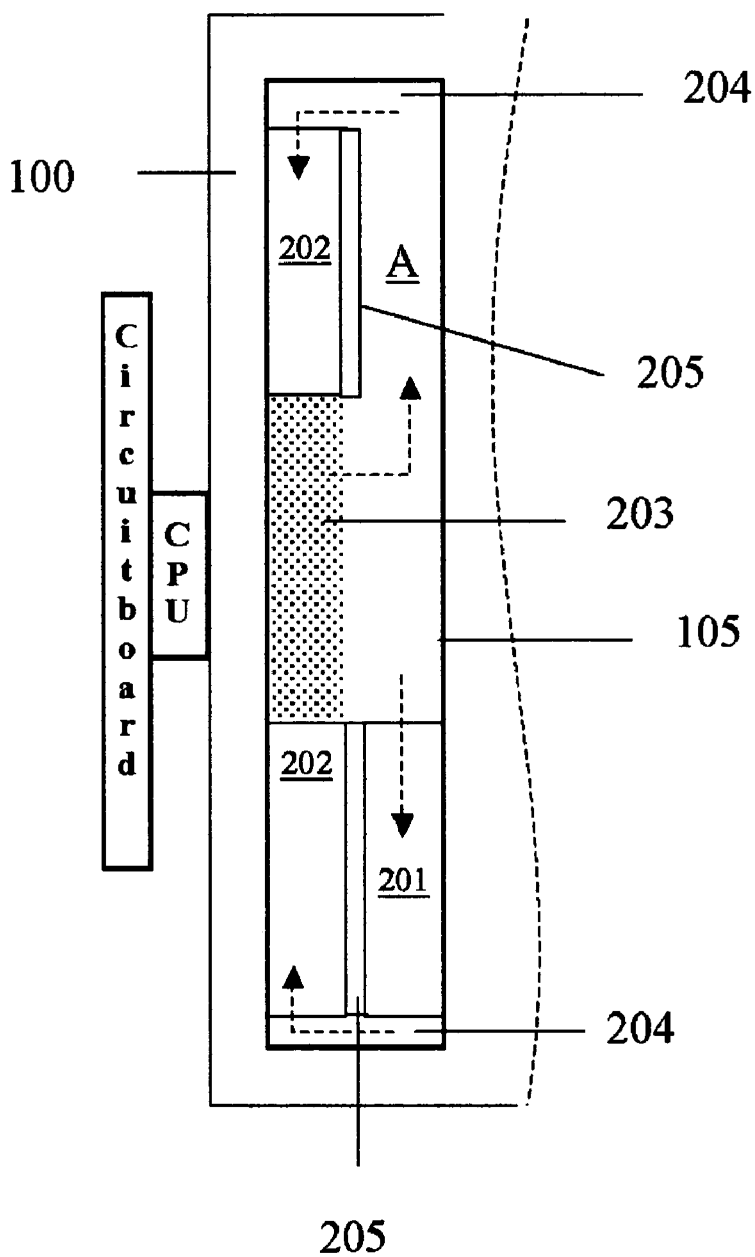
FIG. 13 Ninth embodiment of this invention.

FIG. 13 shows a ninth embodiment of this invention. This embodiment is a modified version of FIG. 12. The first set of top parallel grooves 201 in FIG. 12 is omitted and replaced with a space A. As the vapor from the wick 203 enters space A, part of it condenses on the inner wall of the metal base 100. The condensed liquid either drops to the first set of bottom parallel grooves 201 or is driven upward by the vapor flow across the conveying slot 204 into the second set of top parallel grooves 202. The liquid in the grooves 202 then flows back to the wick 203 by gravity in addition to the capillary action of the wick 203.

Figure 14:
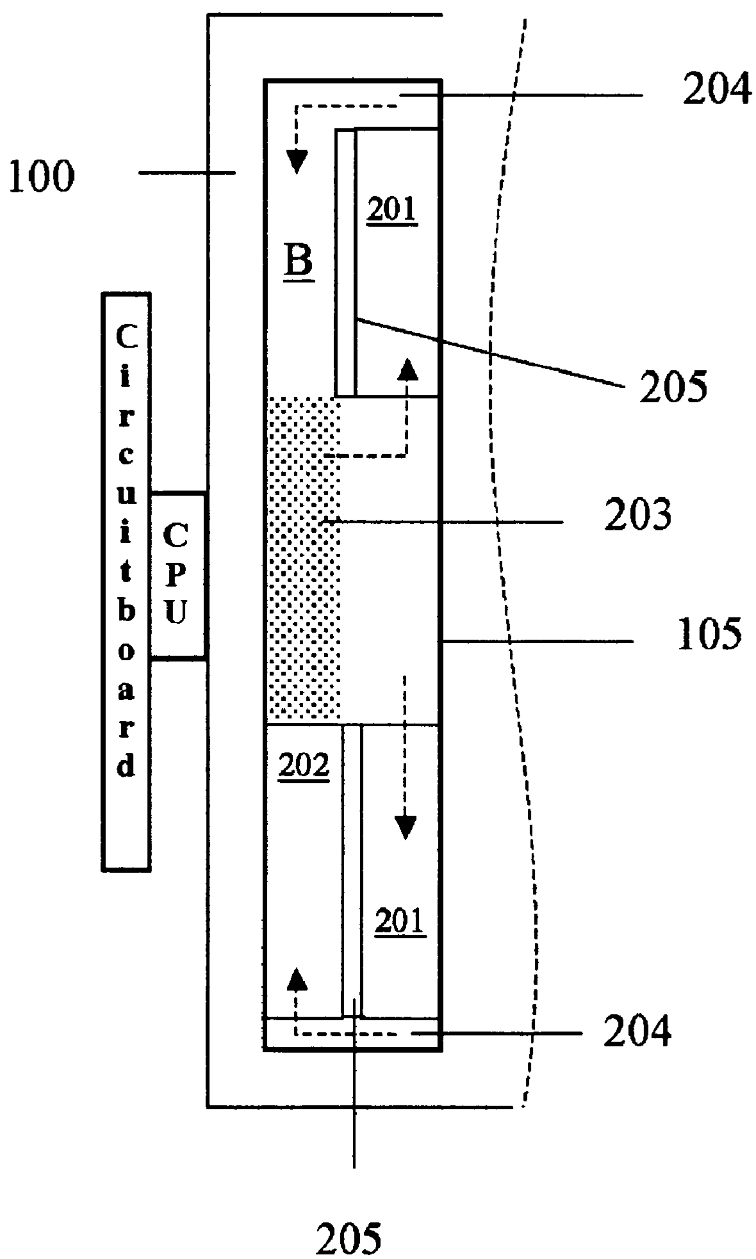
FIG. 14 Tenth embodiment of this invention.

FIG. 14 shows a tenth embodiment of this invention. This embodiment is a modified version of FIG. 12. The second set of top parallel grooves 202 in FIG. 12 is omitted and replaced with a space B. The space B functions as a passage for the condensed liquid to flow back to the wick 203 by gravity in addition to the capillary action of the wick 203.

Figure 15:
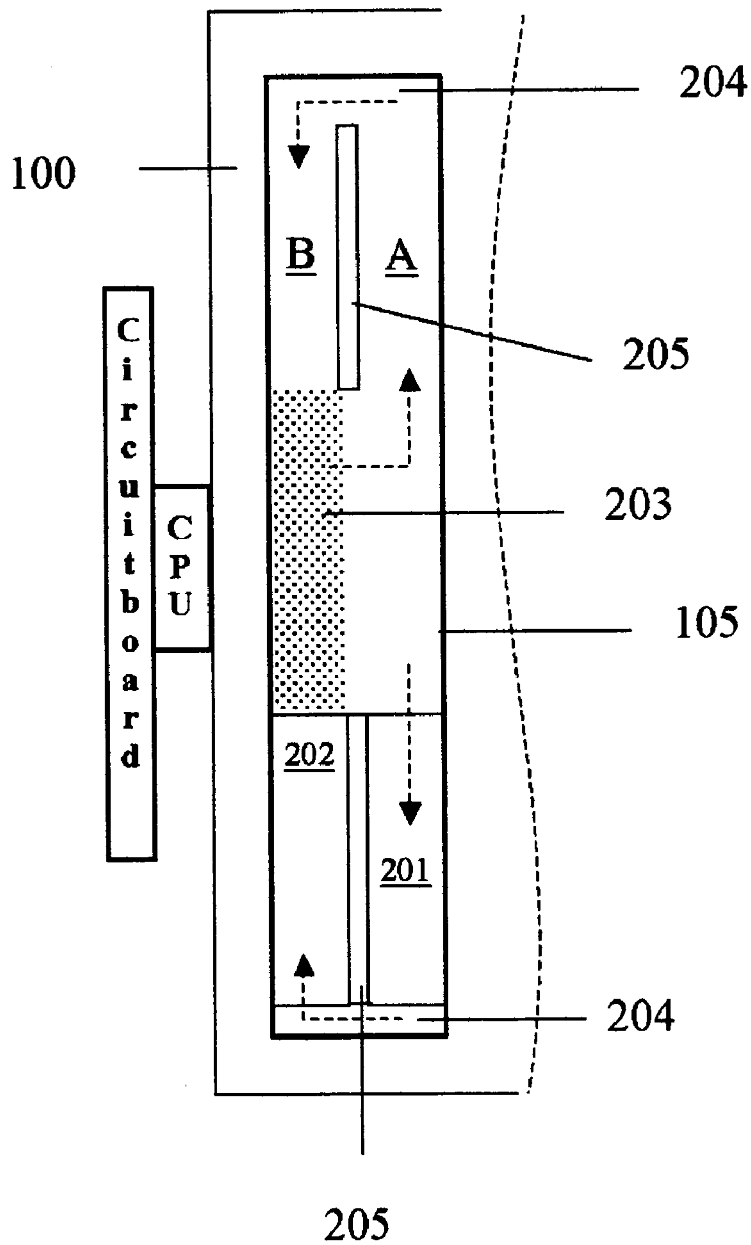
FIG. 15 Eleventh embodiment of this invention.

FIG. 15 shows an eleventh embodiment of this invention. This embodiment is a modified version of FIG. 12. The first set of top parallel grooves 201 in FIG. 12 is omitted and replaced with a space A; the second set of top parallel grooves 202 is omitted and replaced with a space B. The space B functions as a passage for the condensed liquid to flow back to the wick 203 by gravity in addition to the capillary action of the wick 203.

Figure 16:
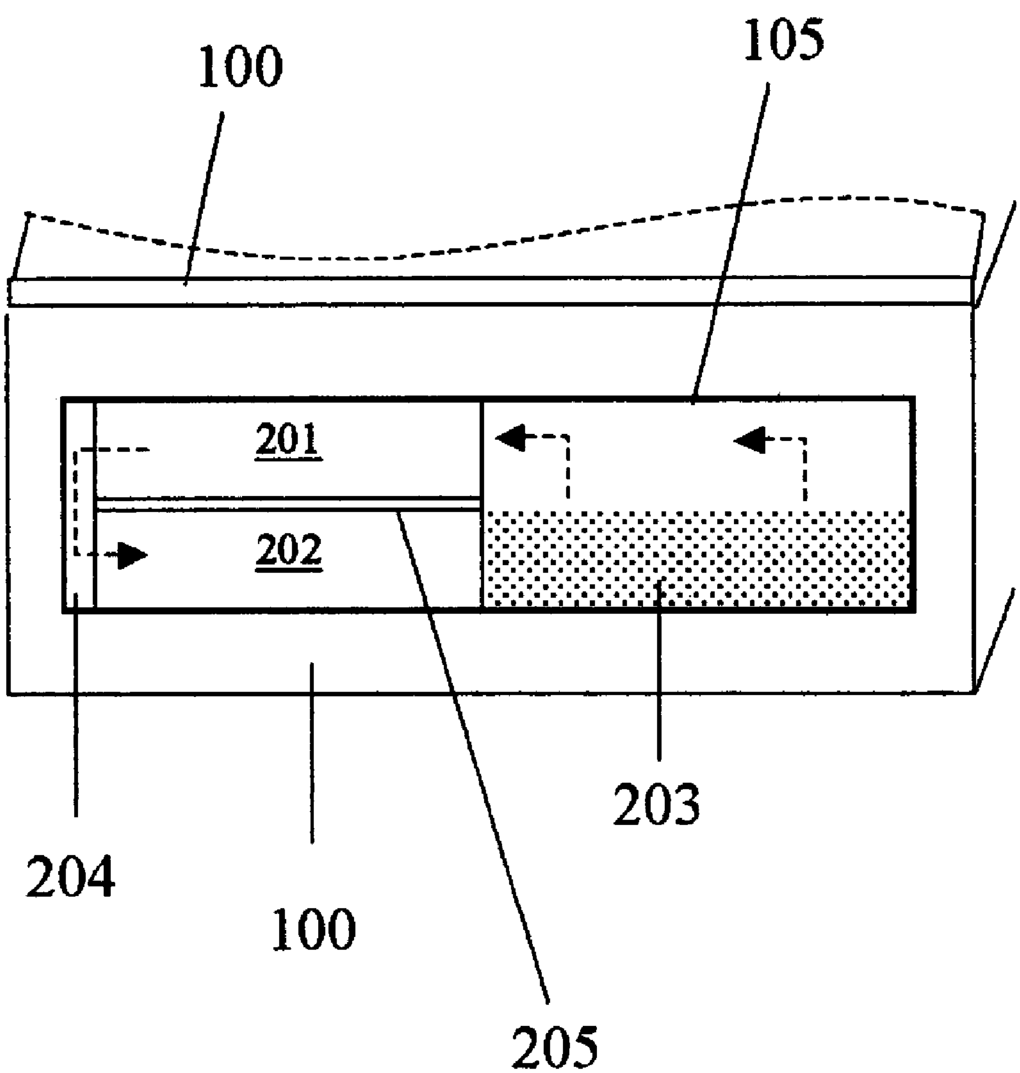
FIG. 16 Twelfth embodiment of this invention.

FIG. 16 shows a twelfth embodiment of this invention. This embodiment is a simplified version of FIG. 3 or FIG. 4. A single first set of parallel grooves 201 and a single second set of parallel grooves 202 is used. The recycle mechanism is exactly the same as described in FIG. 3 or FIG. 4.

Figure 17:
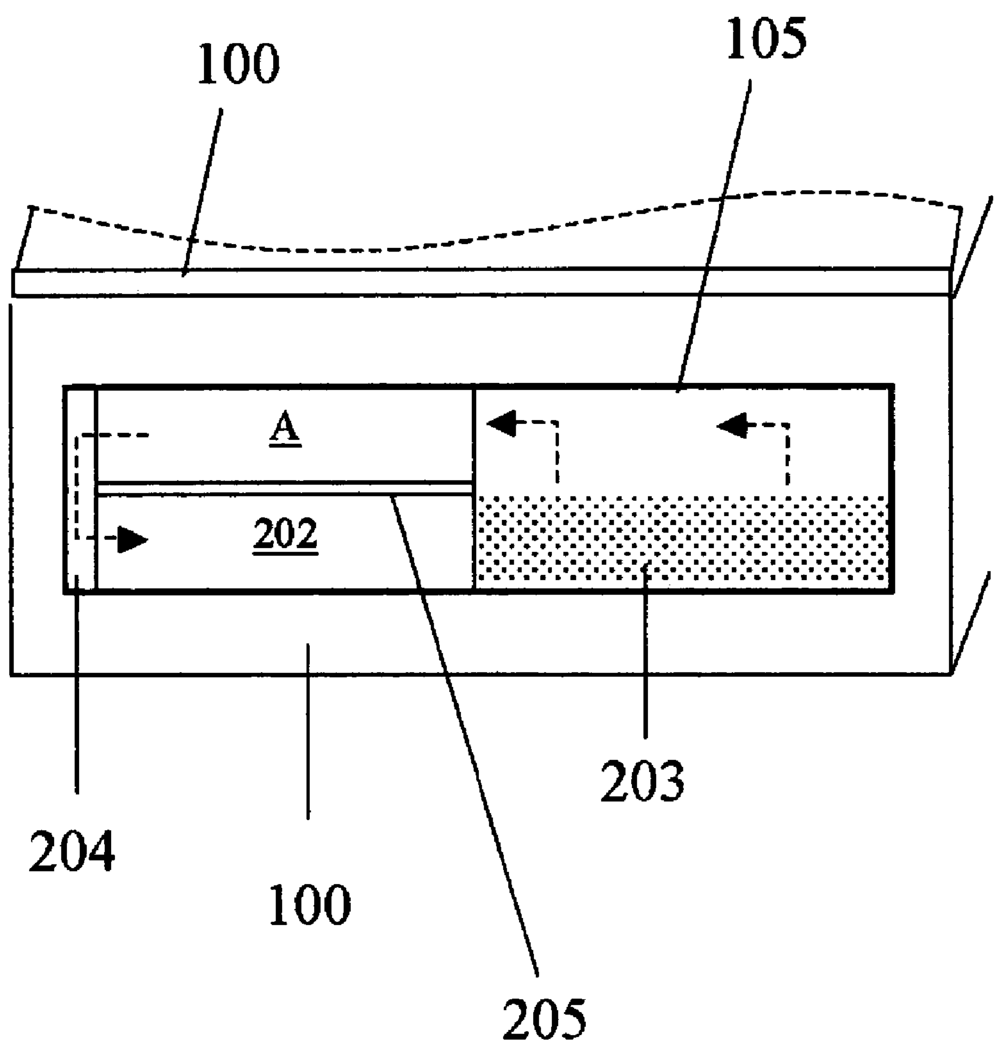
FIG. 17 Thirteenth embodiment of this invention.

FIG. 17 shows a thirteenth embodiment of this invention. This embodiment is a modified version of FIG. 16. The first set of parallel grooves 201 in FIG. 16 is omitted and replaced with a space A. As the vapor form the wick 203 enters space A, part of it condenses on the inner wall of the metal base 100. The condensed liquid is driven by the vapor flow across the conveying slot 204 into the second set of parallel grooves 202. The second set of parallel grooves 202 functions as a passage for the condensed liquid to flow back to the wick 203 by capillary action of the wick 203.

Figure 18:
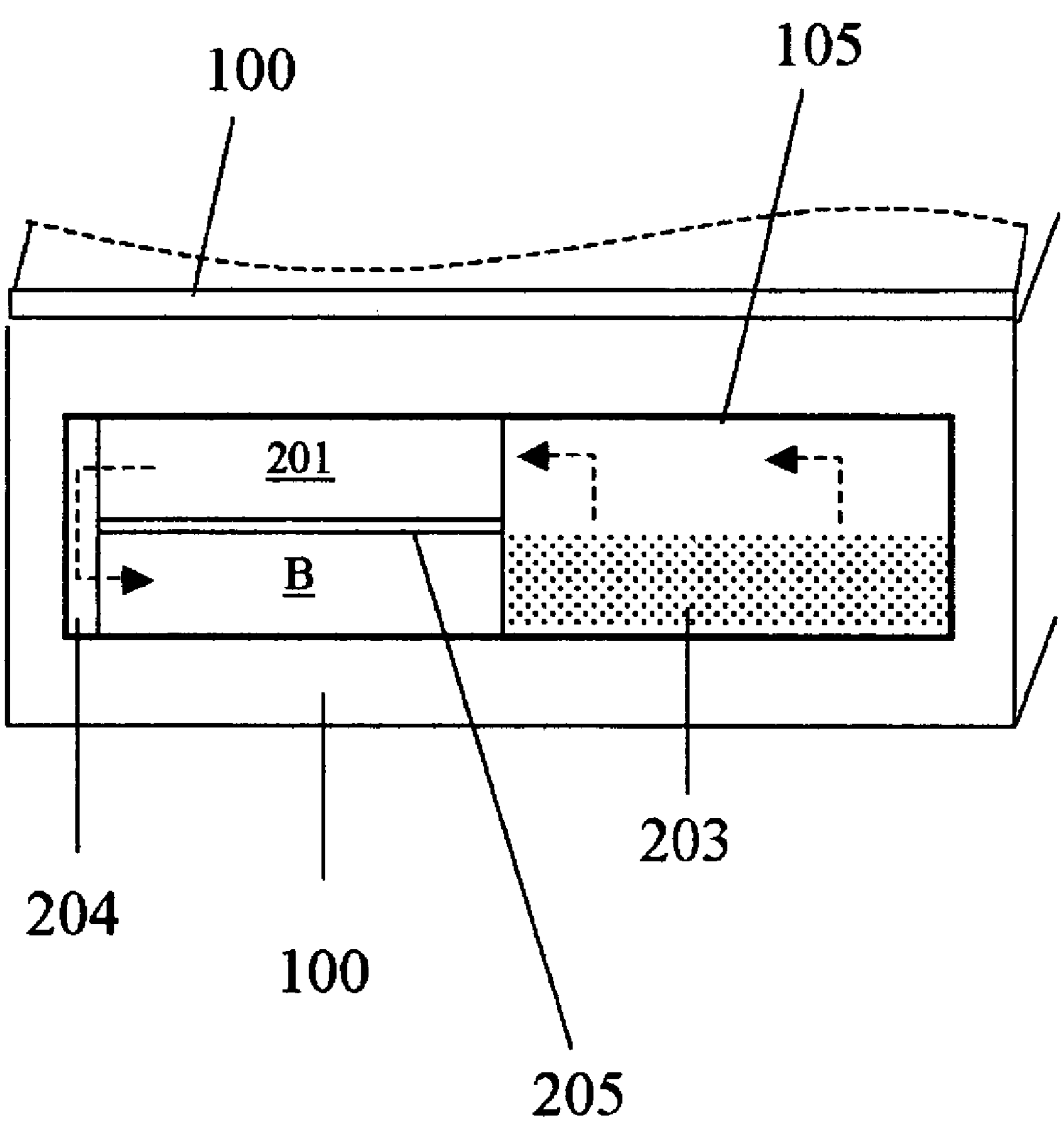
FIG. 18 Fourteenth embodiment of this invention.

FIG. 18 shows a fourteenth embodiment of this invention. This embodiment is a modified version of FIG. 16. The second set of parallel grooves 202 in FIG. 16 is omitted and replaced with a space B. The space B functions as a passage for the condensed liquid to flow back to the wick 203 by capillary action of the wick 203.

Figure 19:
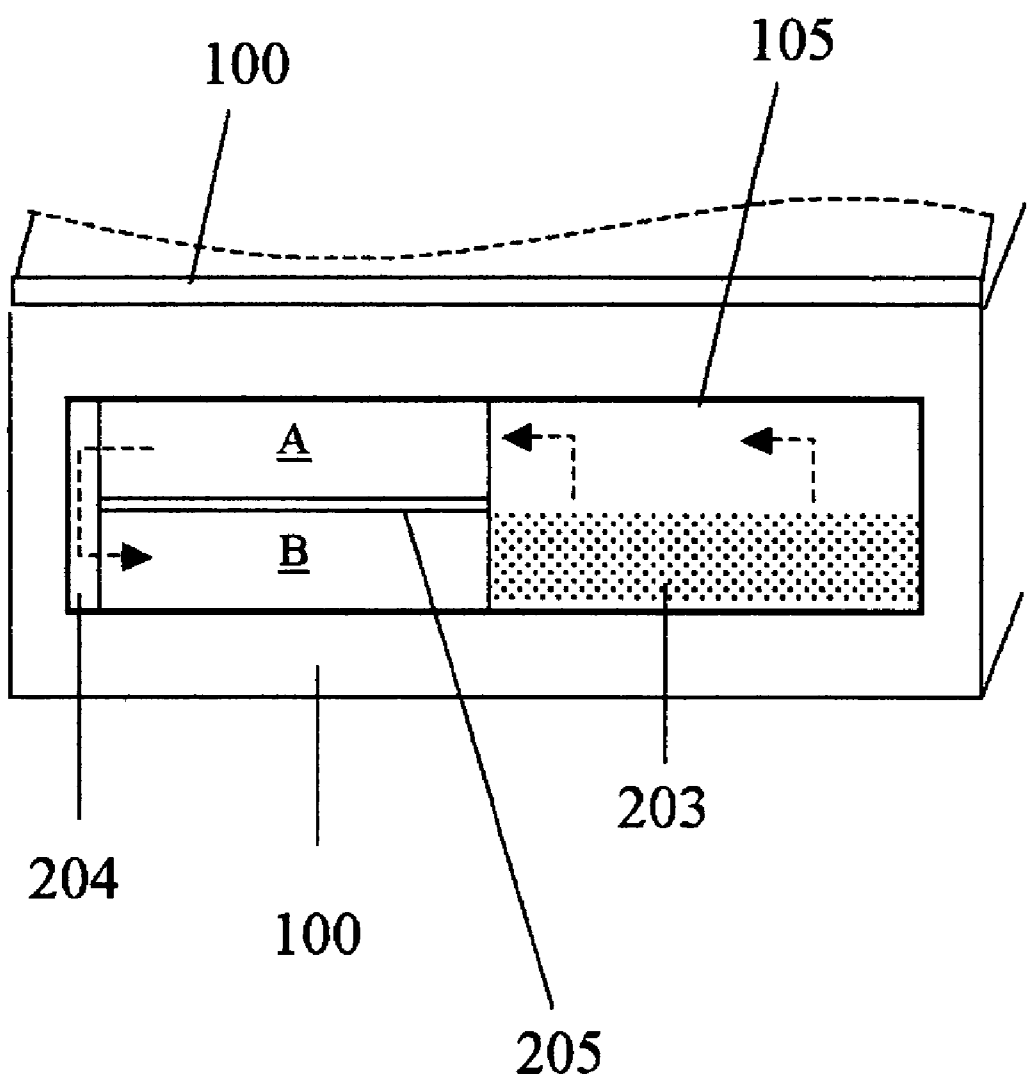
FIG. 19 Fifteenth embodiment of this invention.

FIG. 19 shows a fifteenth embodiment of this invention. This embodiment is a modified version of FIG. 16. The first set of parallel grooves 201 in FIG. 16 is omitted and replaced with a space A; the second set of parallel grooves 202 is omitted and replaced with a space B. As the vapor form the wick 203 enters space A, part of it condenses on the inner wall of the metal base 100. The condensed liquid is driven by the vapor flow across the conveying slot 204 into the second set of parallel grooves 202 The space B functions as a passage for the condensed liquid to flow back to the wick 203 by the capillary action of the wick 203.

Figure 20:
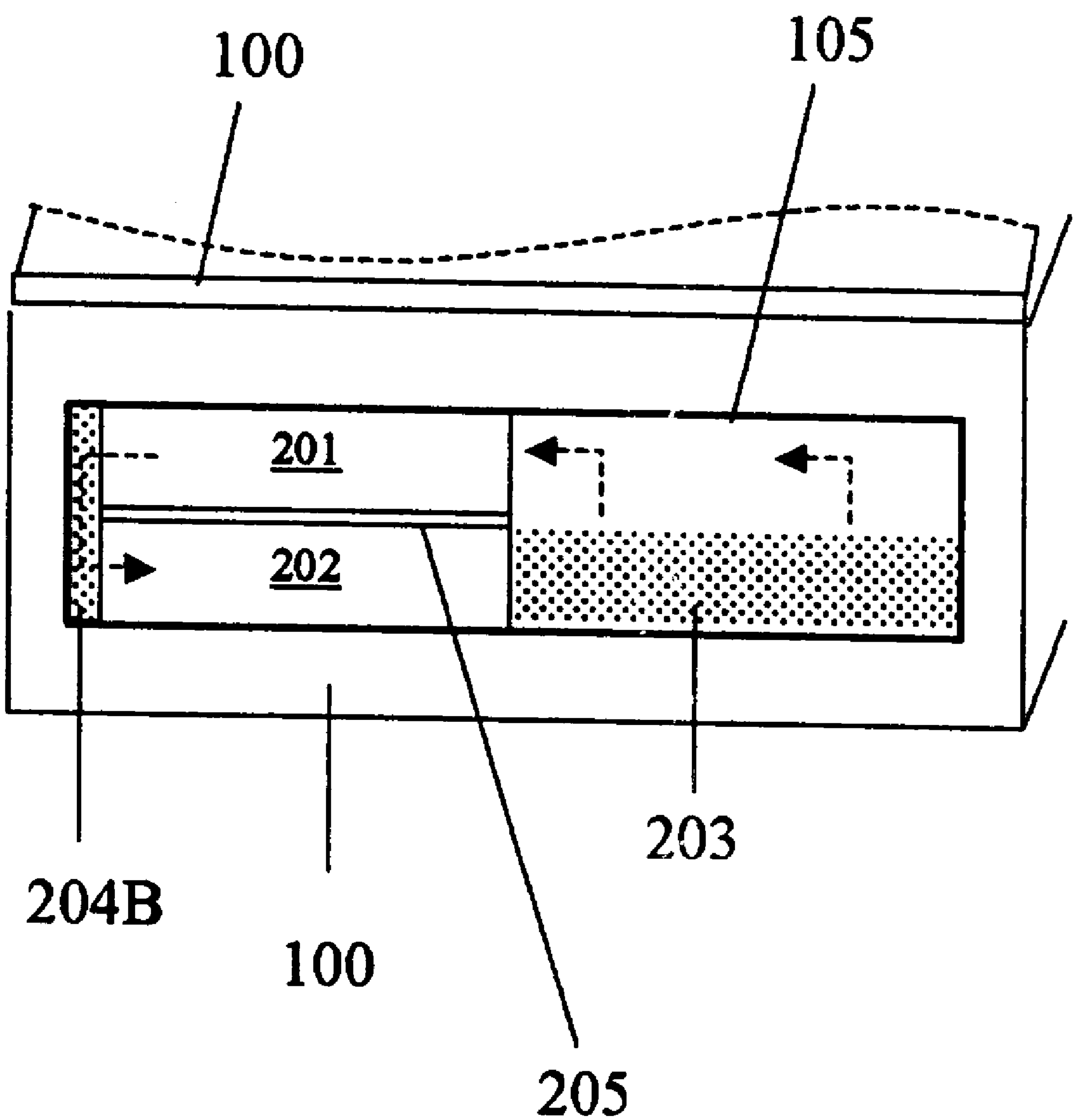
FIG. 20 Sixteenth embodiment of this invention.

FIG. 20 shows a sixteenth embodiment of this invention. This embodiment is a modification to all the previous embodiments. FIG. 20 shows a second wick 204B inserted into the slot 204 to smooth the liquid flow. The capillary action within 204B grabs the condensed liquid stronger than a slot 204 as shown in the previous embodiments. This design prevents the vapor from entering the second set of parallel grooves 202 and, therefore, leads to a smoother liquid flow.

While the preferred embodiment of the invention have been described, it will be apparent to those skilled in the art that various modifications may be made without departing from the spirit of the present invention. Such modifications are all within the scope of this invention.

The invention claimed is:

1. A heat sink for a heat generating device, comprising:

an enclosed metal chamber in contact with said heat generating device;

a two-phase vaporizable coolant recycled in said chamber to remove heat from said heat generating device;

a flow path comprising an upper section and a lower section, said upper section and said lower section being separated by an isolation plate and connected by a conveying conduit at ends for said coolant to flow from said upper section to said lower section, said upper section being in contact with the inner top wall of said chamber for vapor condensation and heat dissipation;

said lower section functioning as part of a recycling passage for the condensed coolant;

a wick evaporator in contact with said lower section to draw said condensed coolant from said lower section by a capillary element, and said coolant collected within said evaporator waiting to be vaporized by the heat from said heat generating device; and a guiding plane mounted on top of said capillary element to allow part of coolant condensed on the inner top surface of said chamber to flow downward back to the capillary element.

2. The heat sink as described in claim 1, wherein said guiding plate is of meshed metal.

* * * * *